United States Patent
Takata et al.

(10) Patent No.: US 6,789,297 B2
(45) Date of Patent: Sep. 14, 2004

(54) METHOD OF MANUFACTURING A SURFACE ACOUSTIC WAVE ELEMENT

(75) Inventors: Eiichi Takata, Nagaokakyo (JP); Yasuji Yamamoto, Osaka (JP); Toshimaro Yoneda, Ishikawa-ken (JP); Michio Kadota, Kyoto (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 308 days.

(21) Appl. No.: 10/054,907

(22) Filed: Jan. 25, 2002

(65) Prior Publication Data

US 2002/0062542 A1 May 30, 2002

Related U.S. Application Data

(62) Division of application No. 09/546,862, filed on Apr. 10, 2000, now Pat. No. 6,564,439.

(30) Foreign Application Priority Data

Apr. 28, 1999 (JP) ............................................ 11-122507

(51) Int. Cl.⁷ ............................................... H04R 17/00
(52) U.S. Cl. ...................... 29/25.35; 29/594; 29/609.1; 204/192.32; 204/192.33; 204/192.35; 216/62; 216/66
(58) Field of Search ................................ 29/25.35, 594, 29/609.1; 204/192.32, 192.33, 192.35; 216/62, 66

(56) References Cited

U.S. PATENT DOCUMENTS

| | | | |
|---|---|---|---|
| 4,403,165 A | | 9/1983 | Ballato et al. |
| 4,507,581 A | * | 3/1985 | Tabuchi et al. ......... 310/313 B |
| 4,756,794 A | | 7/1988 | Yoder |
| 5,235,236 A | | 8/1993 | Nakahata et al. |
| 5,343,107 A | | 8/1994 | Shikata et al. |
| 5,356,870 A | | 10/1994 | Fujiwara et al. |
| 5,446,329 A | | 8/1995 | Nakahata et al. |
| 5,497,726 A | | 3/1996 | Shikata et al. |
| 5,774,962 A | | 7/1998 | Satoh et al. |
| 5,906,950 A | | 5/1999 | Keller et al. |
| 5,914,646 A | | 6/1999 | Hashimoto |
| 5,932,950 A | | 8/1999 | Yamada et al. |
| 5,996,199 A | * | 12/1999 | Ichikawa et al. .......... 29/25.35 |
| 6,185,801 B1 | | 2/2001 | Kadota et al. |
| 6,262,513 B1 | * | 7/2001 | Furukawa et al. ...... 310/313 R |
| 6,426,583 B1 | * | 7/2002 | Onishi et al. ........... 310/313 R |

FOREIGN PATENT DOCUMENTS

| | | | | |
|---|---|---|---|---|
| JP | 61-20410 | 1/1986 | | |
| JP | 61-41446 | 9/1986 | | |
| JP | 7-074573 | 9/1986 | | |
| JP | 01238213 A | * 9/1989 | ............ H03H/3/10 |
| JP | 2-189011 | 7/1990 | | |

(List continued on next page.)

OTHER PUBLICATIONS

R. Subramanian et al.; Production Trimming of SAW Devices Using $CF_4$ Chemistry and its Effects on SAW Characteristics; Jan. 1996; IEEE Ultrasonics Symposium; PP 255–260.

(List continued on next page.)

*Primary Examiner*—A. Dexter Tugbang
*Assistant Examiner*—Paul D Kim
(74) *Attorney, Agent, or Firm*—Keating & Bennett, LLP

(57) ABSTRACT

A method of manufacturing a surface acoustic wave element includes the steps of providing a piezoelectric body having an interdigital transducer, where the interdigital transducer is made of a metal having a higher density than the piezoelectric body, and performing ion bombardment of the interdigital transducer and the piezoelectric body simultaneously so as to reduce the thickness of the interdigital transducer and the piezoelectric body.

7 Claims, 6 Drawing Sheets

FOREIGN PATENT DOCUMENTS

| | | | |
|---|---|---|---|
| JP | 5-299960 | 11/1993 | |
| JP | 6-6160 | 1/1994 | |
| JP | 6-97760 | 4/1994 | |
| JP | 6-120416 | 4/1994 | |
| JP | 6-120759 | 4/1994 | |
| JP | 6-188664 | 7/1994 | |
| JP | 6-268463 | 9/1994 | |
| JP | 8-139546 | 5/1996 | |
| JP | 09270654 A | * 10/1997 | ............ H03H/3/08 |

OTHER PUBLICATIONS

Takehiko Uno et al; "Frequency Trimming of SAW Devices by Sputter Etching"; NTT Electrical Communications Laboratories, Musashino, Tokyo 180; Dec. 1985; Proceedings of the 6$^{th}$ Symposium on Ultrasonic Electronics, Tokyo 1985; Japanese Journal of Applied Phusics; vol. 25 (1986) Supplement 25–1; PP. 145–147.

* cited by examiner

METHOD OF MANUFACTURING A SURFACE ACOUSTIC WAVE ELEMENT

This application is a Divisional of U.S. patent application Ser. No. 09/546,862 filed Apr. 10, 2000, now U.S. Pat. No. 6,564,439.

BACKGROUND OF THE INVENTION

1. Field of the Invention

The present invention relates to a method of manufacturing a surface acoustic wave element and a surface acoustic wave apparatus. More particularly, the present invention relates to a method of manufacturing and adjusting the frequency of a surface acoustic wave element.

2. Description of the Related Art

A conventional frequency adjusting or trimming method for a surface acoustic wave device which reduces the thickness of an interdigital transducer (IDT) or piezoelectric substrate is disclosed in Japanese Unexamined Patent Publication No. 2-189011.

In the conventional method, as shown in FIG. 6A, IDT 21a is selectively etched so as to reduce the thickness of the IDT 21a, thereby increasing the frequency thereof. Alternatively, as shown in FIG. 6B, the upper surface of an exposed piezoelectric substrate 20a is selectively etched so as to partially reduce the thickness of the piezoelectric substrate 20a, thus reducing the frequency.

However, when IDT 21a is made of Al, which is the most common material used for surface acoustic wave devices, reduction in the thickness of the IDT causes very little increase in the frequency. Thus, adjusting the frequency by reducing the thickness of IDTs is not a practical and commercially useful method.

In general, as a method of performing an etching treatment, a wet etching method has been used. However, since the fine size treatment achievable through the use of this method is only up to 1 $\mu$m, there is the problem that it is impossible for such a method to be used for treating an IDT having a smaller line width. Moreover, since the precision achieved with an etching method is relatively low, it is likely that the surface of the piezoelectric substrate will also be partially etched during the etching process, although the IDT is only required to be etched. As a result, it is impossible to adjust the frequency characteristic of an elastic surface acoustic wave device such that the adjustment is carried out as freely as desired.

Additionally, a method that is capable of providing a high treatment precision is the Reactive Ion Etching (RIE) method. However, the RIE method requires that the whole wafer be etched in the chamber of the RIE device. So, if electrode films within a wafer do not have uniform thickness, it is impossible to effect a partial etching treatment. Thus, a uniform thickness is required to ensure as many good products as possible.

Moreover, when a wafer is divided into several chip units of surface acoustic wave elements, these chip units are required to be adjusted individually in the RIE method. However, this kind of adjustment is not very efficient so that it results in high production costs.

Further, the selective etching of the IDT or the piezoelectric substrate depends on the chemical properties of the IDT and piezoelectric substrate. As a result, there may not exist a suitable etchant or etching gas that can selectively etch either the IDT or the piezoelectric substrate.

In addition, with the RIE method, when an IDT made of Al is to be formed on a piezoelectric substrate made of quartz crystal, $CF_4$ is used as the reactive gas to adjust the frequency. At this time, an etching treatment using $CF_4$ on the quartz crystal and Al will result in the quartz crystal being etched more than the Al. As a result, the frequency will have to be adjusted by obtaining a condition that is substantially the same as in which the upper surface of the piezoelectric substrate shown in FIG. 6B is selectively etched. However, when such a method is used for adjusting the frequency, it is required that the piezoelectric substrate be etched in a large amount in order to obtain a large frequency change. On the other hand, if the piezoelectric substrate is etched too much and in too large an amount, the characteristic of the piezoelectric substrate will be deteriorated due to the etching treatment. As a result, an adjustment can only be performed in a range in which there is no characteristic deterioration. Consequently, a problem occurs in that the range for adjusting the frequency is very narrow.

SUMMARY OF THE INVENTION

To overcome the problems described above, preferred embodiments of the present invention provide a method of manufacturing a surface acoustic wave device in which the frequency of the surface acoustic wave device is adjustable over a wide range. The preferred embodiments also provide a method which allows the surface acoustic wave device to be adjusted for each discrete device, and to be adjusted while measuring the frequency, or such that the frequency measurement may be changed over to a frequency adjustment or vice versa.

One preferred embodiment of the present invention provides a method of manufacturing a surface acoustic wave element including the steps of providing a piezoelectric substrate having an interdigital transducer, where the interdigital transducer has a higher density than the piezoelectric substrate, and ion bombarding the interdigital transducer and the piezoelectric body simultaneously.

In another preferred embodiment of the present invention, a method of manufacturing a surface acoustic wave device includes the steps of disposing a metal film on a piezoelectric body, where the metal film has a higher density than the piezoelectric body, forming a plurality of interdigital transducers on the piezoelectric body, cutting the piezoelectric body into a plurality of surface acoustic wave elements such that each of the surface acoustic elements has at least one interdigital transducer, simultaneously etching the at least one interdigital transducer and the piezoelectric body, and packaging at least one of the surface acoustic wave elements.

In another preferred embodiment of the present invention, a method of manufacturing a surface acoustic wave device includes providing a wafer, forming a plurality of interdigital transducers on the wafer, forming a plurality of surface acoustic wave elements, each of the surface acoustic wave elements having at least one interdigital transducer, packaging at least one of the surface acoustic wave elements, and adjusting a frequency of the packaged surface acoustic wave element.

In preferred embodiments of the present invention, the surface of the piezoelectric body is also preferably etched since such a surface is similarly bombarded by the ions in the same way that the IDTs are bombarded. However, since the IDTs are made of a metal having a greater density than that of the piezoelectric body, the frequency change caused by the etching of the piezoelectric body is not as great as the frequency change caused by the etching of the IDTs. Thus, the net frequency change is preferably higher.

Further, it is possible to achieve a partial bombardment of the ions on the wafer so that only a partial adjustment is performed. For example, it is possible to select certain ones of the plurality of surface acoustic wave elements disposed on a wafer, thereby allowing adjustment of only the selected elements, or just select a desired IDT of a surface acoustic wave element and adjust the same.

As described in the above, with the method of the present invention, since the surface acoustic wave device is made by forming a metal film having a higher density than the piezoelectric body, and since ions are caused to physically bombard the elastic surface acoustic wave device so as to reduce the thickness of the IDT film, and since the IDTs have a significant effect on the frequency, it is possible to adjust the frequency without having to scrape off large amounts of the piezoelectric material as in the RIE method.

Further, since ions physically bombard the surface acoustic wave device so that the thickness of IDTs or a metal film is greatly reduced, it is possible to locally concentrate the high energy, thus making it possible to effect a frequency adjustment in individual elements or to effect a partial adjustment of the frequency in a shortened time period.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description of preferred embodiments described below and with reference to the accompanying drawings which are given by way of illustration only, and thus do not limit the present invention and wherein.

DETAILED DESCRIPTION OF PREFERRED EMBODIMENTS

One of the unique features of preferred embodiments of the present invention includes forming on a piezoelectric substrate an interdigital transducer (IDT) which has a higher density than the piezoelectric substrate, and etching the IDT and the piezoelectric substrate at the same time via ion bombardment. Etching via ion bombardment is mainly a physical process. Thus, the method of preferred embodiments of the present invention can be applied to many different combinations of substrates and IDTs. In addition, since the IDTs have a density larger than the piezoelectric substrate, etching of the IDTs predominantly effects frequency adjustment of the surface acoustic wave devices, whereby the frequency of the surface acoustic wave device can be adjusted or trimmed. In most cases, the frequency is adjusted so that it is increased.

Figure 1:
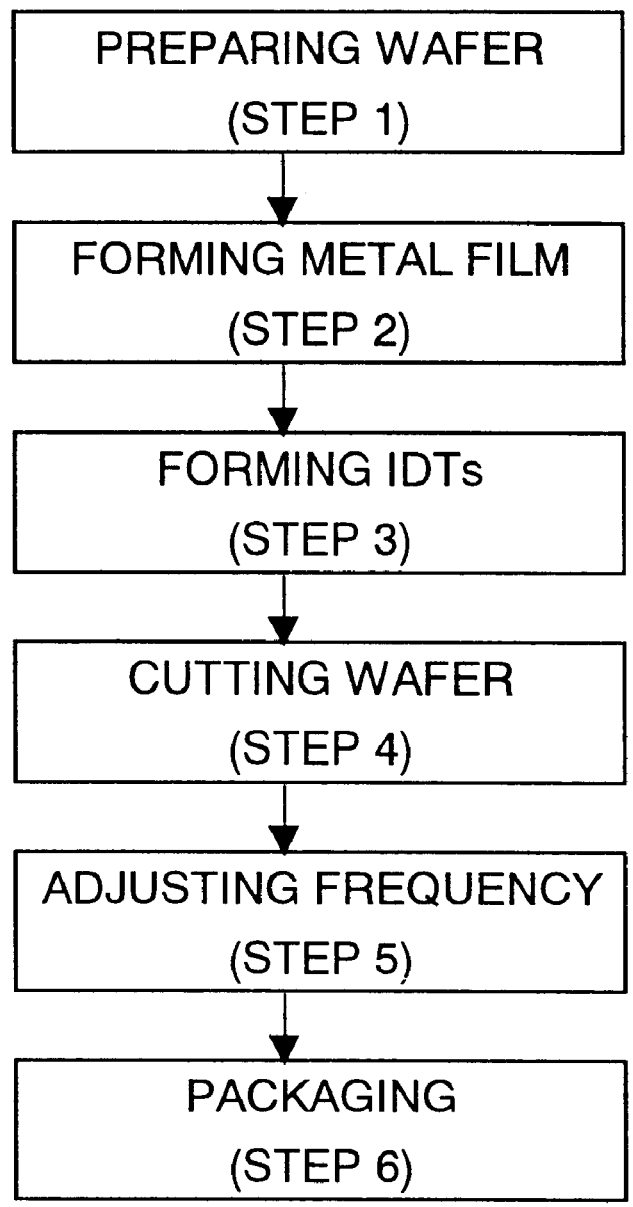
FIG. 1 is a block diagram illustrating a manufacturing process according to a first preferred embodiment of the present invention.

FIG. 1 is a block diagram illustrating a process of manufacturing a surface acoustic wave device according to a preferred embodiment of the present invention.

FIGS. 2A–2E are perspective views showing the various steps involved in the process of FIG. 1. In the following description, the steps involved in the manufacturing process will be described successively preferably according to production order.

Figure 2A:
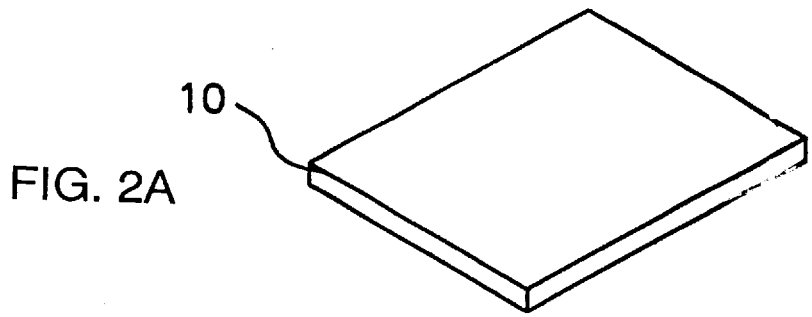
FIGS. 2A to 2E are perspective views illustrating the steps involved in the manufacturing process of the first preferred embodiment of the present invention.
Figure 2B:
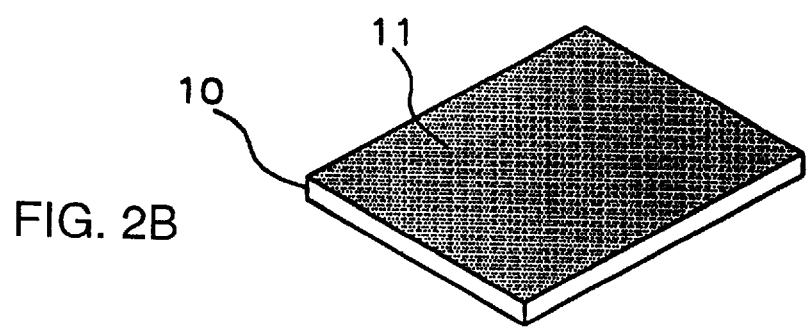
Figure 2C:
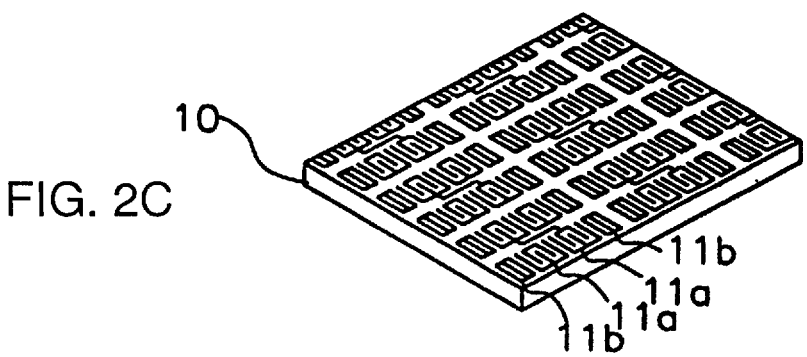
Figure 2D:
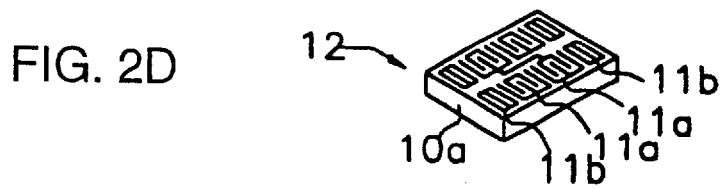
Figure 2E:
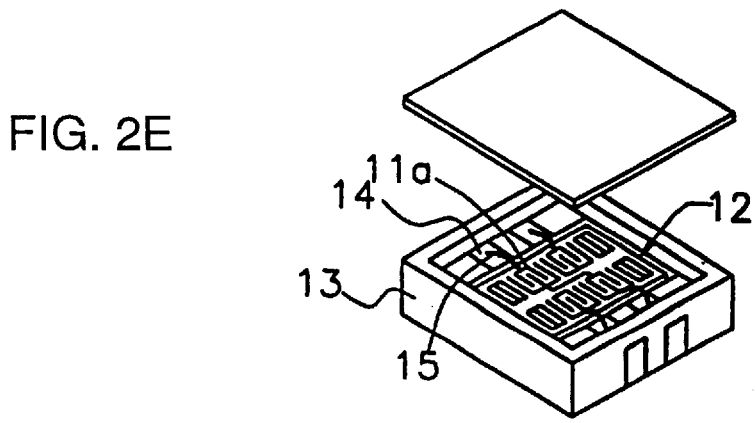

In the first step, a wafer 10 preferably made of a quartz crystal is provided as shown in FIG. 2A. Next, as shown in FIG. 2B, a metal film 11 preferably having Ta as its main component is formed on the upper surface of the wafer 10 by way of vapor deposition or sputtering treatment or other suitable process. Then, portions of the metal film 11 are removed by etching, thus etching out an electrode pattern, thereby forming the plurality of IDTs 11a and the plurality of reflectors 11b, as shown in FIG. 2C. In the next step, as shown in FIG. 2D, the wafer 10 is cut at portions where the IDTs 11a and reflectors 11b are not located, and a combination of IDTs 11a and reflectors 11b define one surface acoustic wave element. Then, either the IDTs 11a and the reflectors 11b or the piezoelectric substrate 10a of the surface acoustic wave element are etched in order to adjust the frequency characteristic of the surface acoustic wave element until the desired characteristic is achieved. Next, as shown in FIG. 2E, the surface acoustic wave element 12 is inserted into a package 13, so as to electrically connect the electrodes 14 of the package 13 with IDTs 11a via a bonding wire 15.

Figure 3:
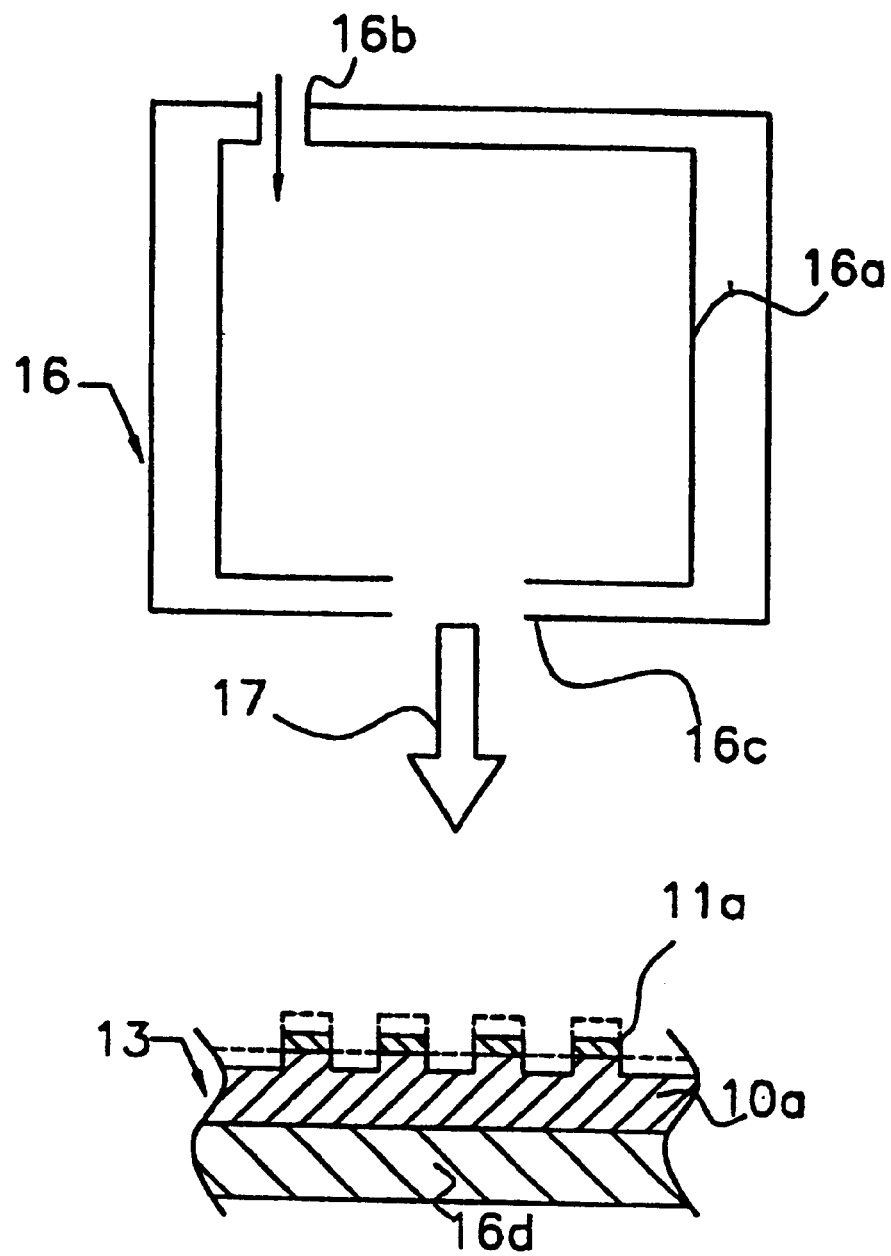
FIG. 3 is a partially enlarged cross-sectional view showing the etched state of IDTs in the first preferred embodiment of the present invention.

FIG. 3 is a schematic view illustrating the process for adjusting the frequency of the surface acoustic wave element in a preferred embodiment of the present invention.

As shown in FIG. 3, an ion sputtering apparatus 16 has an ion gun 16a, a gas inlet 16b for introducing a gas such as Ar to produce a sputtering effect, a grid 16c, a stage 16d to support the surface acoustic wave element 13. Further, an ion beam 17 collides into the surface of the surface acoustic wave element 13 so that it is possible to etch the surface of the IDT 11a preferably made of Ta and the surface of the piezoelectric substrate 10a preferably made of quartz crystal.

At this moment, since there is no change in either the etching rate of the Ta or the etching rate of the quartz crystal, they are etched in the same amount. However, the amount of etching required of the Ta for the frequency to shift towards the high frequency side is much less than the amount of etching required of the quartz crystal for the frequency to shift towards the low frequency side. So, by this etching process, the frequency of the surface acoustic wave element 13 is adjusted so as to be higher.

Note that the method of the present invention is not limited to being applied to a longitudinally coupled elastic surface acoustic wave filter having reflectors. In fact, the present invention can also be applied to other types of surface acoustic wave devices such as a surface acoustic wave resonator, a laterally coupled filter, a ladder-type filter, and an edge reflection type surface acoustic wave device, which does not have reflectors.

Further, although present preferred embodiments have been described with reference to an IDT made of Ta, the present invention is not be limited to IDTs made of Ta. In fact, the IDT may be made of W, Au, Ag, Pt, Mo, Ni, Fe, Cu, Co, Cr, Zn, Mn or an alloy, or other suitable materials having a density that is greater than that of the piezoelectric substrate.

Moreover, although in the present preferred embodiments, quartz crystal was used as the material for the piezoelectric substrate, the present invention is not limited to a piezoelectric substrate made of quartz crystal. It is also possible that the piezoelectric substrate be made of lithium tantalate, lithium niobate, zinc oxide, lithium tetraborate, langasite or other suitable materials.

Further, although in the present preferred embodiments, Ar was used as the etching gas or the gas for ion bombardment, the present invention is not limited to using Ar gas for ion bombardment. The gas used for ion bombardment can also be carbon fluoride gas such as $CF_4$, $C_2F_6$, or a chlorine gas such as $CCl_4$, $CF_3Cl$, or $N_2$ gas or an $N_2$ gas mixture, or other similar gases. Moreover, it is possible to use different gases. For example, first using Ar gas and then using $N_2$ gas is possible. Alternatively, the etching process may be performed by virtue of plasma treatment using $N_2$ gas.

Moreover, although in the present preferred embodiments an ion gun was used during the etching process, the present invention is not limited to using an ion gun. A common sputtering apparatus can also be used to conduct a reverse sputtering treatment, thereby obtaining the same effect.

Figure 4:
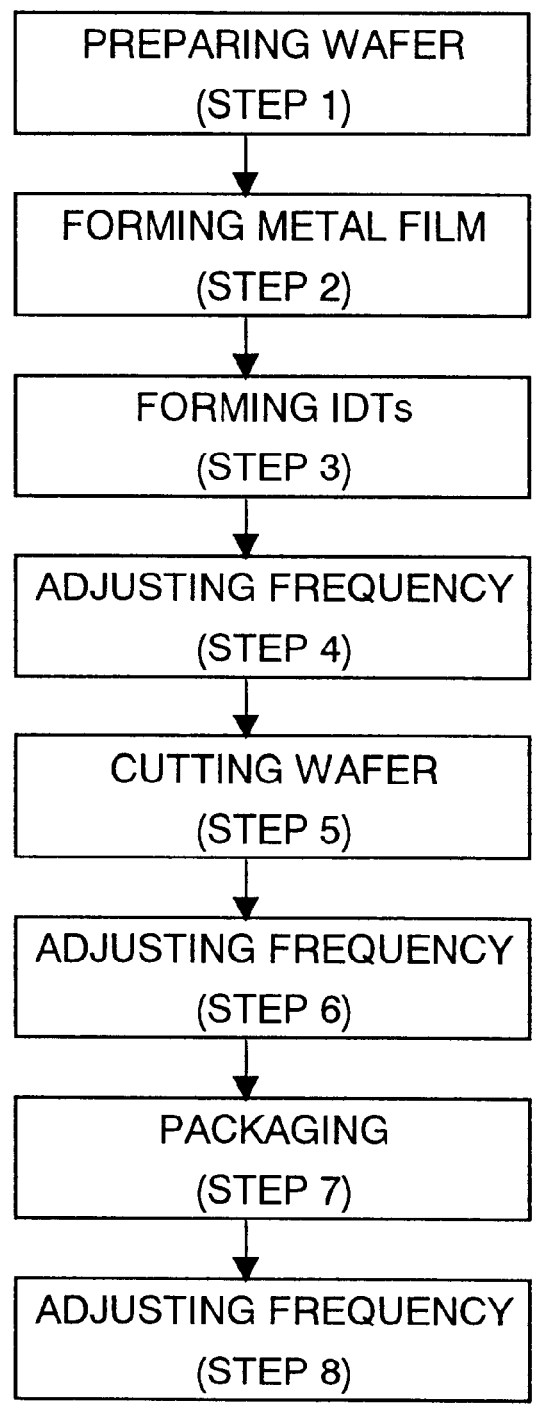
FIG. 4 is a block diagram illustrating a manufacturing process according to a second preferred embodiment of the present invention.

FIG. 4 is a block diagram illustrating the process of manufacturing a surface acoustic wave device according to a second preferred embodiment of the present invention.

The second preferred embodiment is different from the first preferred embodiment in that the process of adjusting the frequency is preferably a multi-step process occurring after formation of the IDT and after the packaging process. The frequency adjustment process after formation of the IDT may be carried out during wafer formation by individually adjusting each element with the use of the apparatus shown in FIG. 3. On the other hand, the frequency adjustment can be performed approximately with the use of a conventional etching treatment.

In carrying out frequency adjustment after the packaging process, a surface acoustic wave element is inserted into a package and is electrically connected through wire bonding or face-down bonding, thereby correcting deviations from the desired frequency in the surface acoustic wave device in the package. At this moment, since this is a different process from the frequency adjustment process conducted after the formation of the IDT, and since it is impossible to use the conventional method, the apparatus of FIG. 3 is preferably used so as to individually adjust the elastic surface acoustic wave device.

Figure 5:
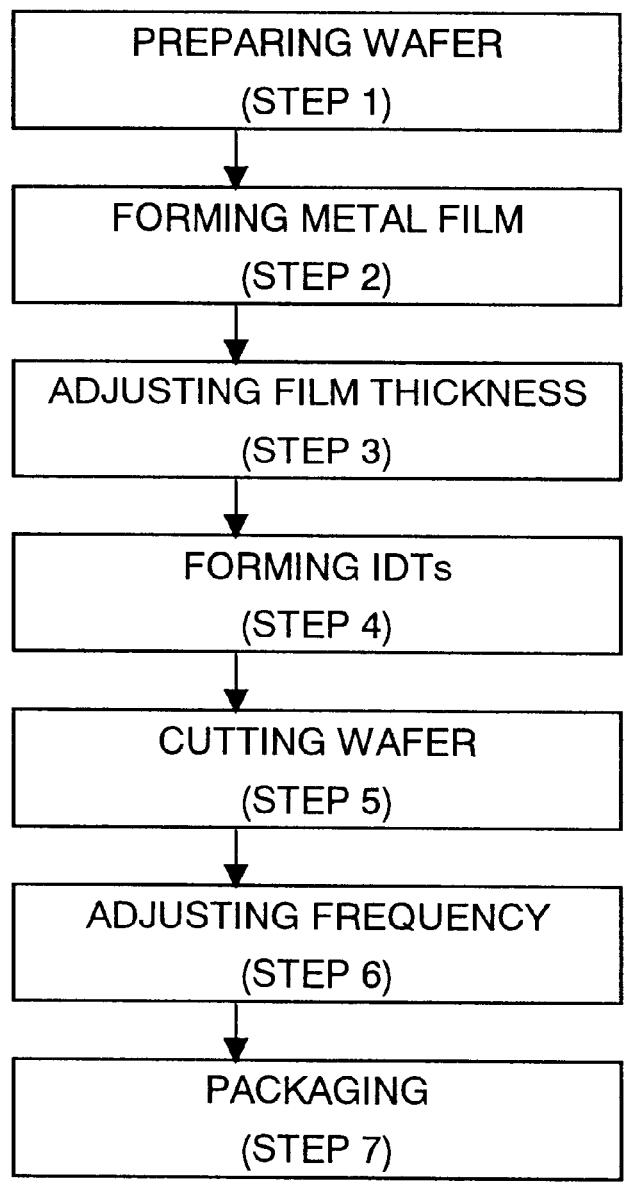
FIG. 5 is a block diagram illustrating a manufacturing process according to a third preferred embodiment of the present invention.
Figure 6A:
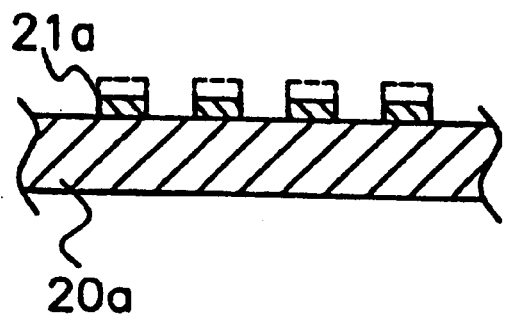
FIG. 6A is a partially enlarged cross-sectional view showing the etched state of IDTs in a conventional etching method, and which also shows the IDTs being selectively etched.
Figure 6B:
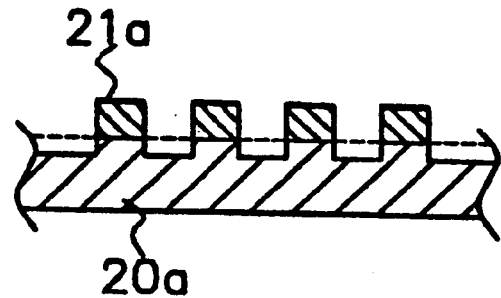
FIGS. 6B is a partially enlarged cross-sectional view showing an etched state of IDTs in a conventional etching method, and which also shows the piezoelectric substrate being selectively etched.

FIG. 5 is a block diagram illustrating a manufacturing process of a surface acoustic wave device according to a third preferred embodiment of the present invention. The third preferred embodiment is different from the first preferred embodiment in that the process of adjusting the film thickness process is carried out after the formation of the metal film.

The process of adjusting the thickness after the metal film is formed may be carried out using a conventional etching method. Alternatively, an approximate adjustment can first be performed using the conventional etching method and then the thickness can be adjusted individually with the use of the apparatus of FIG. 3. In the present method, since the thickness of the metal film is made uniform while in the state of a metal film, it is possible to prevent frequency irregularities caused by thickness variations in the IDT. Therefore, fine adjustments to the frequency of the piezoelectric element can be made after adjusting the film thickness of the metal film.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a piezoelectric device, said method comprising the steps of:

providing a wafer;

forming a plurality of interdigital transducers on the wafer;

forming a plurality of surface acoustic wave elements, each of said surface acoustic wave elements having at least one interdigital transducer;

separating at least one of the plurality of surface acoustic wave elements from the wafer;

packaging the at least one of said the plurality of surface acoustic wave elements; and adjusting a frequency of said packaged surface acoustic wave element, wherein said step of adjusting the frequency includes ion bombarding said packaged surface acoustic wave element.

2. The method of claim 1, further comprising adjusting a frequency of at least one of said surface acoustic wave elements prior to said step of packaging.

3. The method of claim 1, wherein said step of adjusting the frequency includes ion bombarding by applying at feast one of Ar gas, carbon fluoride gas, a chlorine gas, and an $N_2$ gas to said packaged surface acoustic wave element.

4. The method of claim 1, wherein said step of adjusting the frequency includes etching at least one of said interdigital transducers and the wafer.

5. The method of claim 1, wherein the step of forming a plurality of interdigital transducers on the wafer includes disposing a metal film on said wafer.

6. The method of claim 5, wherein the step of forming a plurality of interdigital transducers on the wafer further includes wet etching said metal film.

7. The method of claim 1, further comprising the step of cuffing the wafer at a portion where the plurality of interdigital transducers are not located to form the plurality of surface acoustic wave elements.

* * * * *